United States Patent [19]

Shimoda et al.

[11] Patent Number: 5,014,275

[45] Date of Patent: May 7, 1991

[54] SEQUENTIAL DECODER

[75] Inventors: Kaneyasu Shimoda, Kawasaki; Yuzo Ageno, Yokohama, both of Japan

[73] Assignee: Fujitsu Limited, Kawasaki, Japan

[21] Appl. No.: 398,501

[22] Filed: Aug. 25, 1989

[30] Foreign Application Priority Data

Aug. 25, 1988 [JP] Japan .................................. 63-209512

[51] Int. Cl.$^5$ ............................................. G06F 11/10
[52] U.S. Cl. ................................................... 371/43
[58] Field of Search ............................. 371/43, 44, 45

[56] References Cited

U.S. PATENT DOCUMENTS

| 4,630,032 | 12/1986 | Gordon et al. | 371/43 |
| 4,710,746 | 12/1987 | Shimoda et al. | 371/43 |
| 4,730,322 | 3/1988 | Pollara-Bozzola | 371/43 |

Primary Examiner—Charles E. Atkinson
Attorney, Agent, or Firm—Staas & Halsey

[57] ABSTRACT

A sequential decoder for decoding a systematic and convolutional code signal having a code rate greater than ½ and carrying out error correction coding of the code signal. A local most likely path in a plurality of possible paths for a newly received information bit is determined by calculating a branch metric indicating likelihood of each of the plurality of possible paths in accordance with a predetermined algorithm. The path decision is carried out by a construction including a two-path comparing path decision circuit which receives a pair of bits comprised of an information bit and a parity bit at one time and determining a local most likely path between two possible paths for the information bit. A four-path comparing path decision circuit receives a pair of information bits at one time and determines a local most likely path among four possible paths for the pair of information bits. A parity bit timing detecting circuit detects a timing of an input of the above pair of bits comprised of an information bit and a parity bit. A selecting circuit selects an output of the above two-path comparing path decision circuit at the input timing of the above pair of bits comprised of an information bit and a parity bit, and selects an output of the above four-path comparing path decision circuit at the timing of the input of the above pair of information bits.

5 Claims, 12 Drawing Sheets

Fig. 5

| $I_1$ | $I_2$ | $I_3$ | $I_4$ | $I_5$ | $I_6$ | - - - |
|---|---|---|---|---|---|---|
| $P_1$ | $P_2$ | $P_3$ | $P_4$ | $P_5$ | $P_6$ | - - - |

Fig. 7

| $I_1$ | $P_3$ | $I_5$ | $P_6$ | $I_8$ | - - - - - |
|---|---|---|---|---|---|
| $I_2$ | $I_3$ | $I_4$ | $I_6$ | $I_7$ | - - - - - |
| 1 | 2 | 3 | 4 | 5 | |

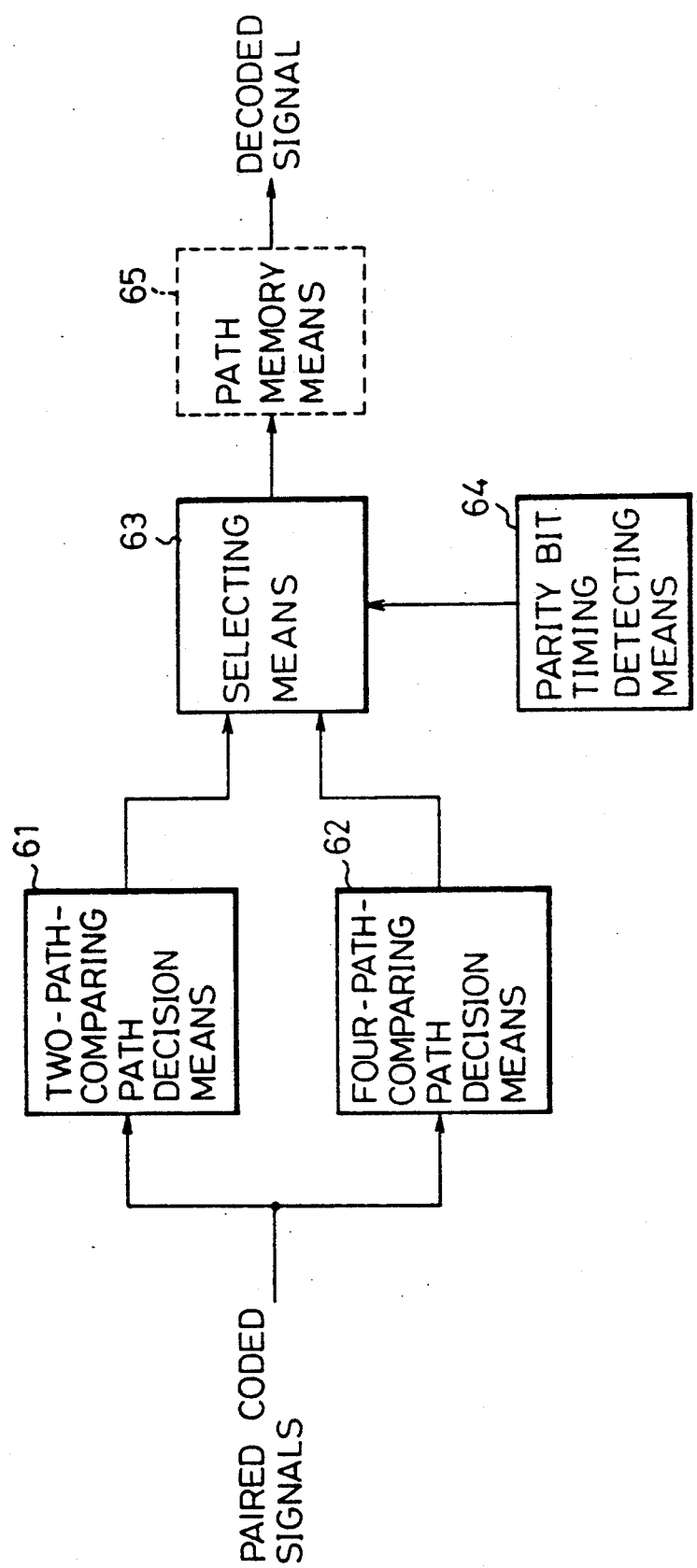

SEQUENTIAL DECODER

BACKGROUND OF THE INVENTION

(1) Field of the Invention

The present invention relates to a sequential decoder for decoding a systematic and convolutional code signal having a code rate greater than ½ and carrying out error correction coding of the code signal. This is achieved by determining a local most likely path in a plurality of possible paths for a newly received information bit by calculating a branch metric indicating likelihood of each of the plurality of possible paths in accordance with a predetermined algorithm.

Error correction coding is used at a receiver side for enabling correction of errors occurring during transmission of data. FIG. 1 shows the construction of an example of an encoder which receives a series of binary data consisting of information bits and generates a parity bit for each information bit. That is, the encoder of FIG. 1 generates a systematic and convolutional code signal having a code rate of ½. An example of coded output corresponding to an input data series "0011101" is shown in FIG. 2.

Usually, sequential decoders have an internal encoder identical to the encoder by which the transmitted signal has been encoded on the sender side. The sequential decoders sequentially decode the transmitted signal using an output of the internal encoder, and selects a local most likely value, of the transmitted signal in a trial and error method. The internal encoder generates a parity bit from information bits which are decoded in the sequential decoder.

Generally, a series of binary data can be expressed as a path consisting of a series of branches in a tree diagram as shown in FIG. 3. Therefore, the process of decoding encoded and transmitted data consists of determining a local most likely path consisting of a series of branches in a tree diagram, and locally (at each node of the tree diagram), the process of sequential decoding corresponds to determination (selection) of a local most likely branch in a plurality of branches extending forward (to the right in FIG. 3) from the node.

Calculation of the likelihood for each branch, and the determination of the local most likely path is carried out in accordance with a predetermined algorithm. The most popular algorithm is known as the Fano algorithm, which is disclosed by R. M. Fano. in "Heuristic Discussion of Probabilistic Decoding", IEEE Transaction of Information Theory, Vol. IT.19, April 1963, pp.64–73, and U.S. Pat. No. 3,457,562. As an other algorithm, the stack algorithm which was independently proposed by Z. Zigangirov ("Some Sequential Decoding Procedures", Probabl. Peredachi Inf., Vol.2, No.4, 1966, pp.13–25), and F. Jelinek ("A Fast Sequential Decoding Algorithm Using a Stack", IBM J. Res. Dev., Vol.13, November 1969, pp. 675–685), respectively, is known. The present invention is applicable to a sequential decoder using both these algorithms.

In particular, error correction coding is used in the field of satellite communication because transmission length without a repeater is long and the power of the received signal is small in satellite communication.

(2) Description of the Related Art

FIG. 4 is a block diagram of a conventional sequential decoder receiving a pair of signal bits consisting of an information bit and a parity bit at one time and sequentially decoding each signal bit using the Fano algorithm.

In the field of satellite communication, quadrature phase shift keying is often used to modulate a signal to be transmitted. In the quadrature phase shift keying (QPSK), a pair of binary signals synchronized with each other are modulated as four phase states of the carrier wave, i. e., the pair of baseband signals (1,1) is modulated to the phase state $\pi/4$, the pair of baseband signals (0,1) is modulated to the phase state $3\pi/4$, the pair of baseband signals (0,0) is modulated to the phase state $-3\pi/4$, and the pair of baseband signals (1,0) is modulated to the phase state $\pi/4$. On the receiver side, received signals are first demodulated to one of the above four pairs of baseband signals (1,1), (0,1), (0,0), and (1,0), and then are decoded in a sequential decoder.

When the transmitted signals are generated by the encoder as shown in FIG. 1, which generates a pair of coded signal bits consisting of an information bit and a parity bit as shown in FIG. 5, the above pair of baseband signals may be the pair of output signals of the encoder. Therefore, the pair of input signals of the sequential decoder of FIG. 4 may be the QPSK output of the above demodulator.

In FIG. 4, reference numeral 1 denotes a buffer memory, 2 denotes a pointer, 4 denotes a path decision circuit, 5 denotes a search direction control circuit, 6 denotes a path memory, and 7 denotes an address counter.

The buffer memory 1 receives and stores received and demodulated (coded) data consisting of a pair of bits comprised of an information bit and a parity bit.

The path decision circuit 4 receives a pair of coded signals consisting of an information bit and a parity bit at one time from the buffer memory 1, internally generates a parity bit from decoded information bits by an internal encoder (not shown in FIG. 4) which is contained in the path decision circuit 4, calculates the branch metric, which is defined by Fano in the aforementioned publications, "Heuristic Discussion of Probabilistic Decoding", IEEE Transaction on Information Theory, Vol. IT-19, April 1963, pp.64–73, and the U.S. Pat. No. 3,457,562, for each information bit, which indicates a local likelihood for each possible branch for the information bit in the forward direction from each node corresponding to the information bit in the tree diagram as shown in FIG. 3. The path decision circuit also selects a local (at the node) most likely branch (path) based on the above-calculated branch metric, and outputs the decoded signal bits corresponding to the above-selected branch. The decoded signals are then written in the path memory 6.

The above branch metric obtained in the path decision circuit 4 is supplied to the search direction control circuit 5.

The search direction control circuit 5 accumulates branch metrics of the branches, each of which has been selected as a local most likely branch at each corresponding node on the selected path, to obtain the path metric, and holds the path metric. That is, the search direction control circuit 5 adds a branch metric in the forward direction which is newly received from the path decision circuit 4, to the path metric held in the search direction control circuit 5. Alternatively, the search direction control circuit or subtracts a branch metric in the backward direction which is calculated in the path decision circuit 4, from the path metric held in the search direction control circuit 5. The search direction control circuit 5 then determines the above direction of the search by comparing the above path metric with a predetermined threshold, and makes the path decision circuit 4 carry out the search operation in the determined direction by supplying a search direction control signal.

If the above path metric is larger than a threshold which is predetermined in accordance with the Fano algorithm, it is determined that the forward search of the local most likely branch can be continued. Or, if the above path metric is not larger than the threshold, it is determined that the preceding forward search at the preceding node, wherein the branch from the preceding node to the above node was selected, was wrong, and the search operation must be restarted from the preceding node excluding the wrong branch.

According to the Fano algorithm, the path metric at each node is renewed when the operation is shifted from one node to the next, i. e., the path metric is not memorized at the timing of the operation at the next node. Therefore, when returning to the preceding node from the above wrong node, the branch metric from the wrong node to the preceding node must be calculated and the calculated branch metric is subtracted from the path metric at the wrong node to again obtain the path metric at the preceding node. This is the backward search process in accordance with the Fano algorithm.

The above operation by the path decision circuit 4 is a well-known procedure in accordance with the Fano algorithm. An example of the path search according to the Fano algorithm is shown in FIG. 6, wherein references a, b, c, . . . each denote a node.

Going back to FIG. 4, the path memory 6 receives and holds the output of the path decision circuit 4 by the above forward search, and outputs the previously held decoded values back to the path decision circuit 4 for use in the backward search The address counter 7 outputs an address to both the buffer memory 1 and the path memory 6. A newly received bit of coded data is written in an address which is determined by the above address from the address counter 7, and one bit of decoded data which has been held in an address which is also determined by the above address from the address counter 7 in the path memory 6, is read out.

The pointer 2 outputs the operating address of the path decision circuit 4, i. e., outputs the address of the node from which node a local most likely path (branch) is obtained by calculating branch metrics for all possible branches from the node in the forward or backward direction.

Furthermore, in the prior art, some of the parity bits are removed from the series of output bits of the encoder at a predetermined rate before being modulated on the sender side to increase the code rate, i. e., to increase transmission efficiency. This method is called the punctured method.

FIG. 7 shows an example of data generated by applying the punctured method to the output of the encoder which generates a pair of data including an information bit and a corresponding parity bit as shown in FIG. 5. In this example, parity bits except the 3n-th parity bits, $P_3$, $P_6$, . . . are removed from the series of FIG. 5. In addition, in FIG. 7, each $(2n-1)$-th bit and $2n$-th bits are paired for QPSK modulation.

In the prior art, when the series of the punctured and paired signals (for example, having a form as in FIG. 7) are received through a demodulator at the receiver side, the form of the series of punctured and paired signals as shown in FIG. 7 are transformed back to the form as shown in FIG. 5 by inserting dummy bits in the positions where the parity bits were previously removed. The transformed series of paired signals are then decoded in the sequential decoder as shown in FIG. 4.

Generally, fast operation of the sequential decoder is required. However, by the construction of FIG. 4, only one information bit is decoded through one forward search operation. Further, by the above punctured method, the inserted dummy bits generally do not coincide with the corresponding correct parity bits. Therefore, the above insertion of dummy bits substantially increases the number of errors, and thus the backward search operation of the Fano algorithm is more frequently carried out. This further lowers the decoding speed.

SUMMARY OF THE INVENTION

An object of the present invention is to provide a sequential decoder wherein the speed of decoding systematic codes having a high code rate is increased.

According to the present invention, there is provided a sequential decoder for decoding a systematic and convolutional code signal having a code rate greater than ½ and carrying out error correction coding of the code signal. The sequential decoder comprises a path decision means for determining a local most likely path in a plurality of possible paths for a newly received information bit by calculating a branch metric indicating the likelihood of each of the plurality of possible in accordance with a predetermined algorithm. The path decision means comprises: a two-path comparing path decision means for receiving a pair of bits comprised of an information bit and a parity bit at one time and determining a local most likely path between two possible paths for the information bit; a four-path comparing path decision means for receiving a pair of information bits at one time and determining a local most likely path among four possible paths for the pair of information bits; a parity bit timing detecting means for detecting the timing of an input of the pair of bits comprised of an information bit and a parity bit; and a selecting means for selecting an output of the two-path comparing path decision means at the timing of the detection of the input of the pair of bits comprised of an information bit and a parity bit, and selecting an output of the four-path comparing path decision means at the timing of the input of the pair of information bits.

BRIEF DESCRIPTION OF THE DRAWINGS

In the drawings:

FIG. 5 is a diagram of coded signal bits pair consisting of an information bit and a parity bit;

FIG. 7 is a diagram of data generated by applying the punctured method to the coded signal bits as shown in FIG. 5;

FIG. 8 is a block diagram of the basic construction of the present invention;

DESCRIPTION OF THE PREFERRED EMBODIMENTS

Figure 1:
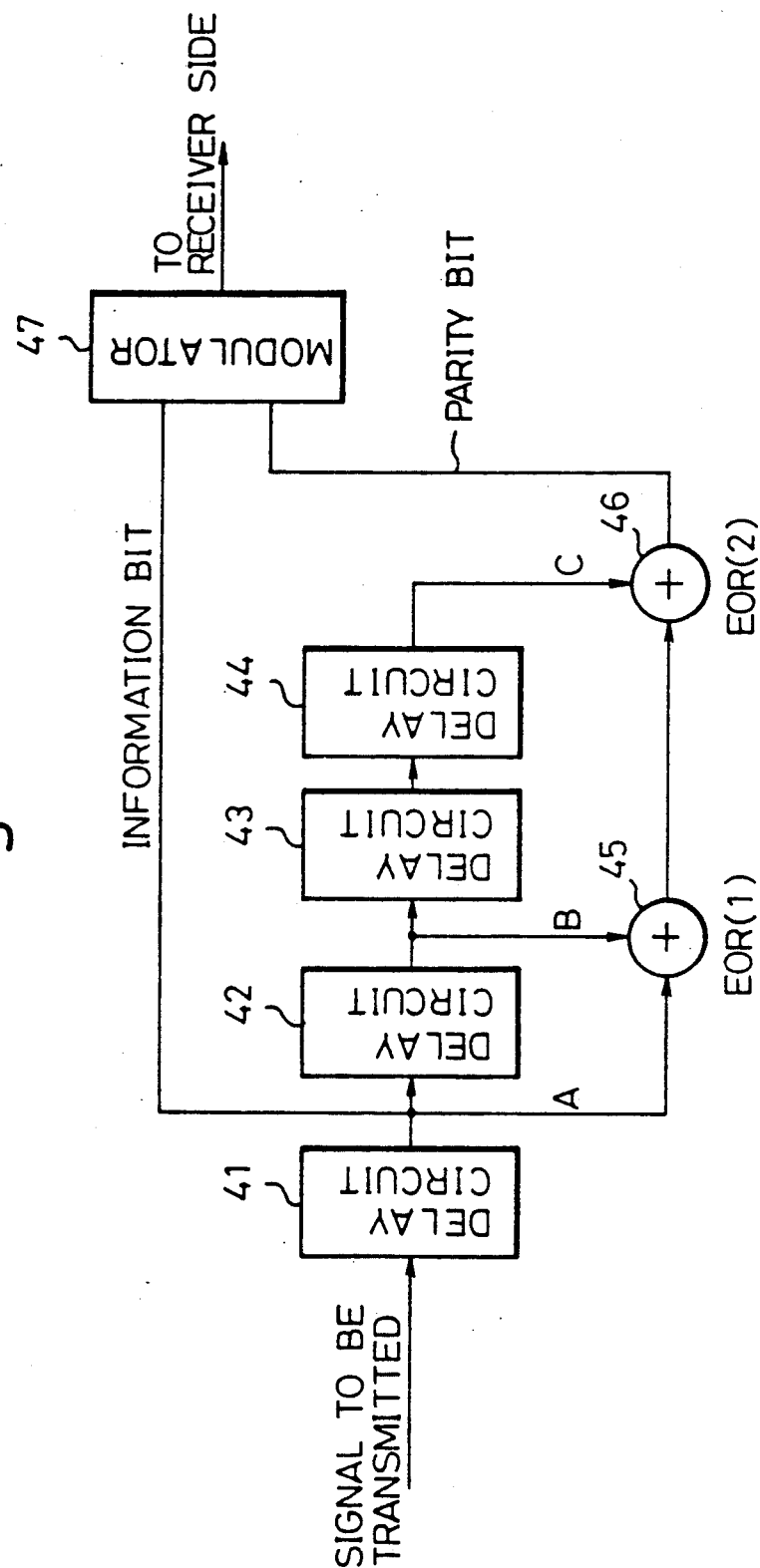
FIG. 1 is a block digram of an encoder which receives a series of binary data consisting of information bits and generates a parity bit for each information bit.
Figure 2:
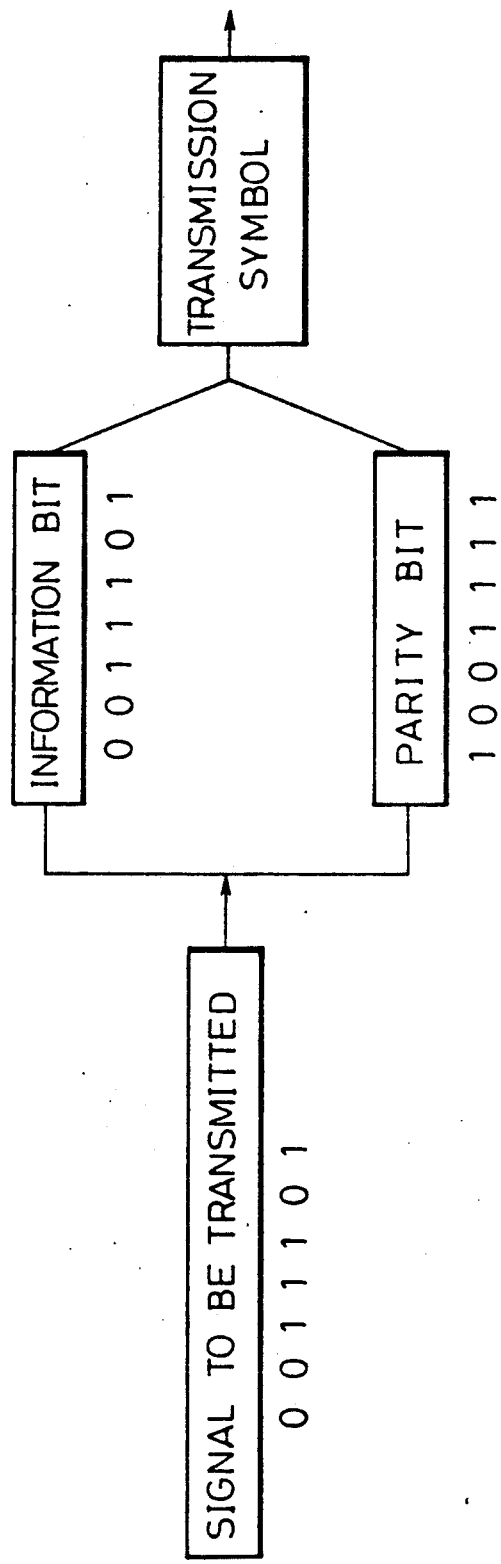
FIG. 2 is a diagram of a coded result for an input data series "0011101"
Figure 3:
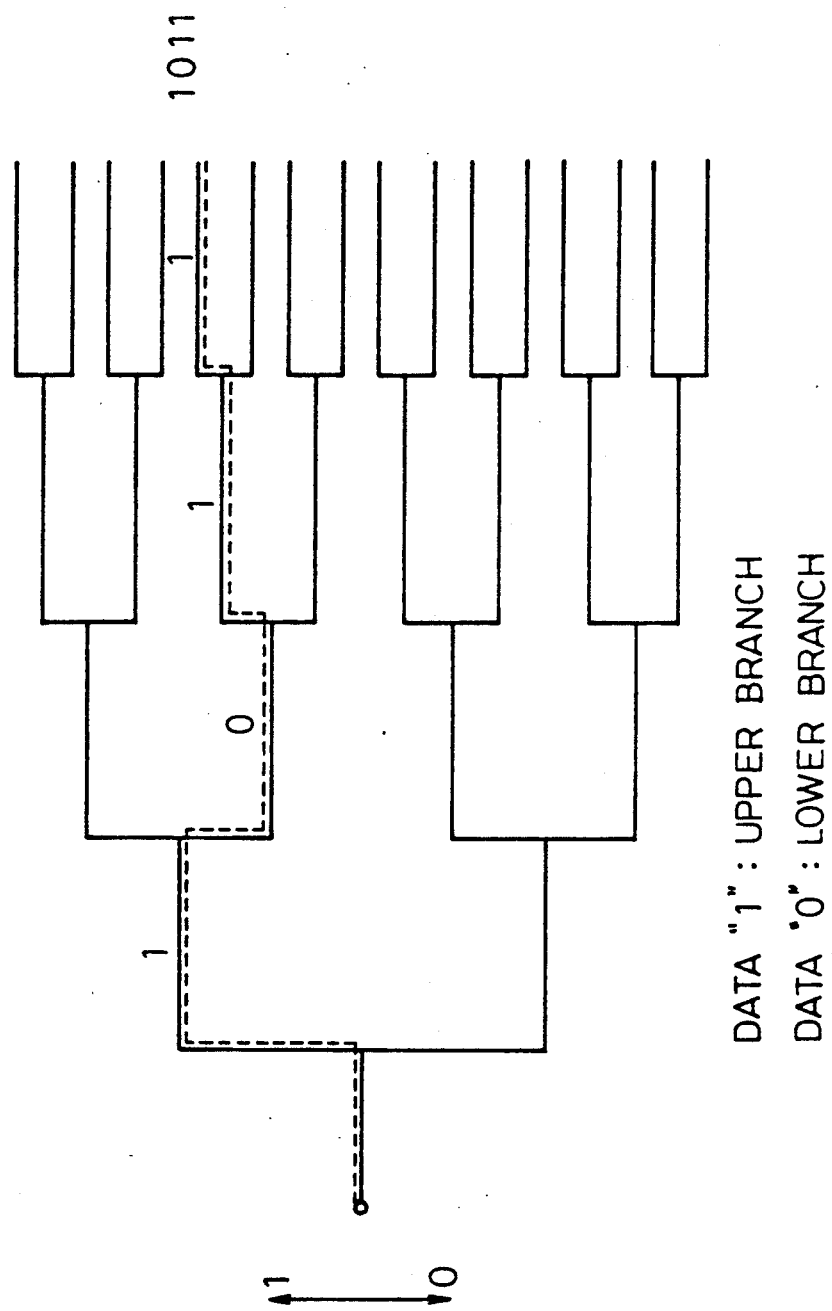
FIG. 3 is a tree diagram.

Before describing the preferred embodiment of the present invention, first, the basic principle of the present invention is explained below.

FIG. 8 is a block diagram of the present invention.

In FIG. 8, reference numeral 61 denotes a two-path comparing path decision means, 62 denotes a four-path comparing path decision means, 63 denotes a selecting means, 64 denotes a parity bit timing detecting means, and 65 denotes a path memory means. The function of each of the above components and the relationship between each other are described in the summary of the invention.

The sequential decoder according to the present invention receives a paired code signal having a code rate greater than $\frac{1}{2}$ and having a form as shown in FIG. 7, i.e., a paired code consisting of a pair of information bits and a periodically appearing pair of bits comprised of an information bit and a parity bit, without inserting any dummy bits. When the above pair of bits comprised of an information bit and a parity bit is received, the sequential decoder carries out a two-path comparing path decision in accordance with a predetermined algorithm. Or, when the above pair of information bits are received, the sequential decoder carries out a four-path comparing path decision in accordance with the predetermined algorithm.

Figure 9:
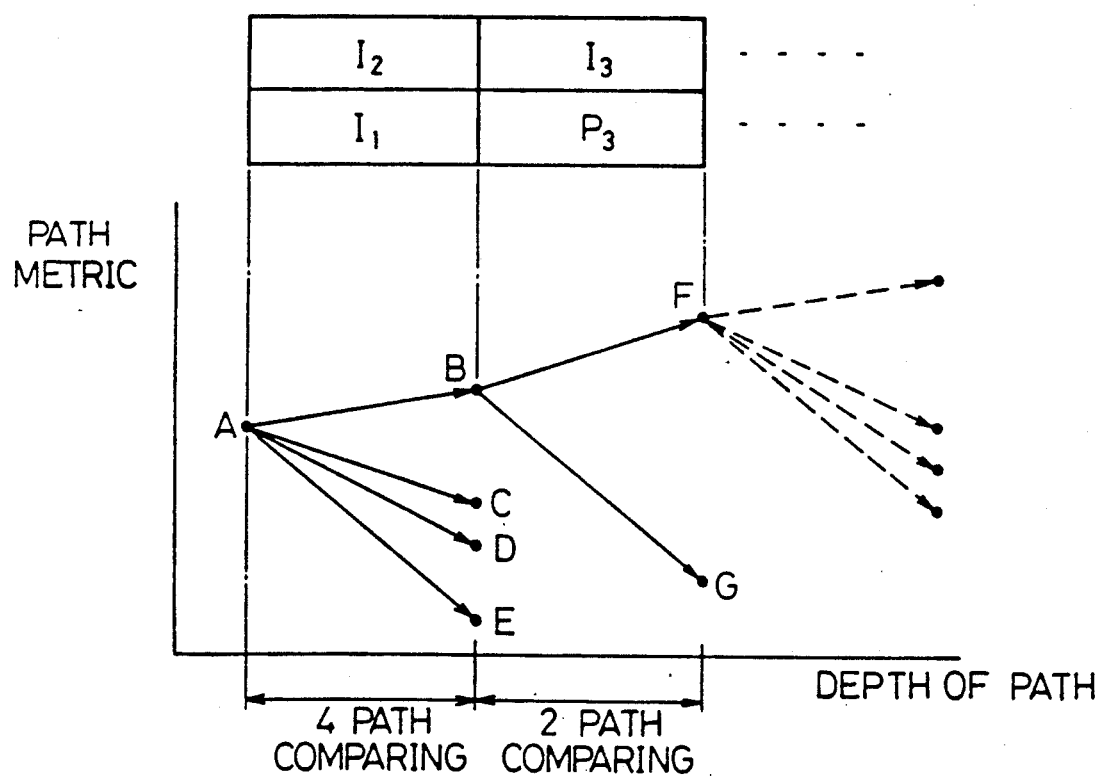
FIG. 9 is a block diagram of typical operation of the present invention.

The above "two-path comparing" means determines local most likely path between two possible paths or branches (which correspond to the two possible values "0" and "1" for one information bit) by comparing the likelihoods for two paths in accordance with the predetermined algorithm. The above "four-path comparing" means determines a local most likely path among four possible paths or branches (which correspond to the four possible combinations of the values of two information bits (1,1), (1,0), (0,0), and (0,1) by comparing the likelihoods for the four paths in accordance with the predetermined algorithm. An example of each case is shown in FIG. 9.

Figure 10:
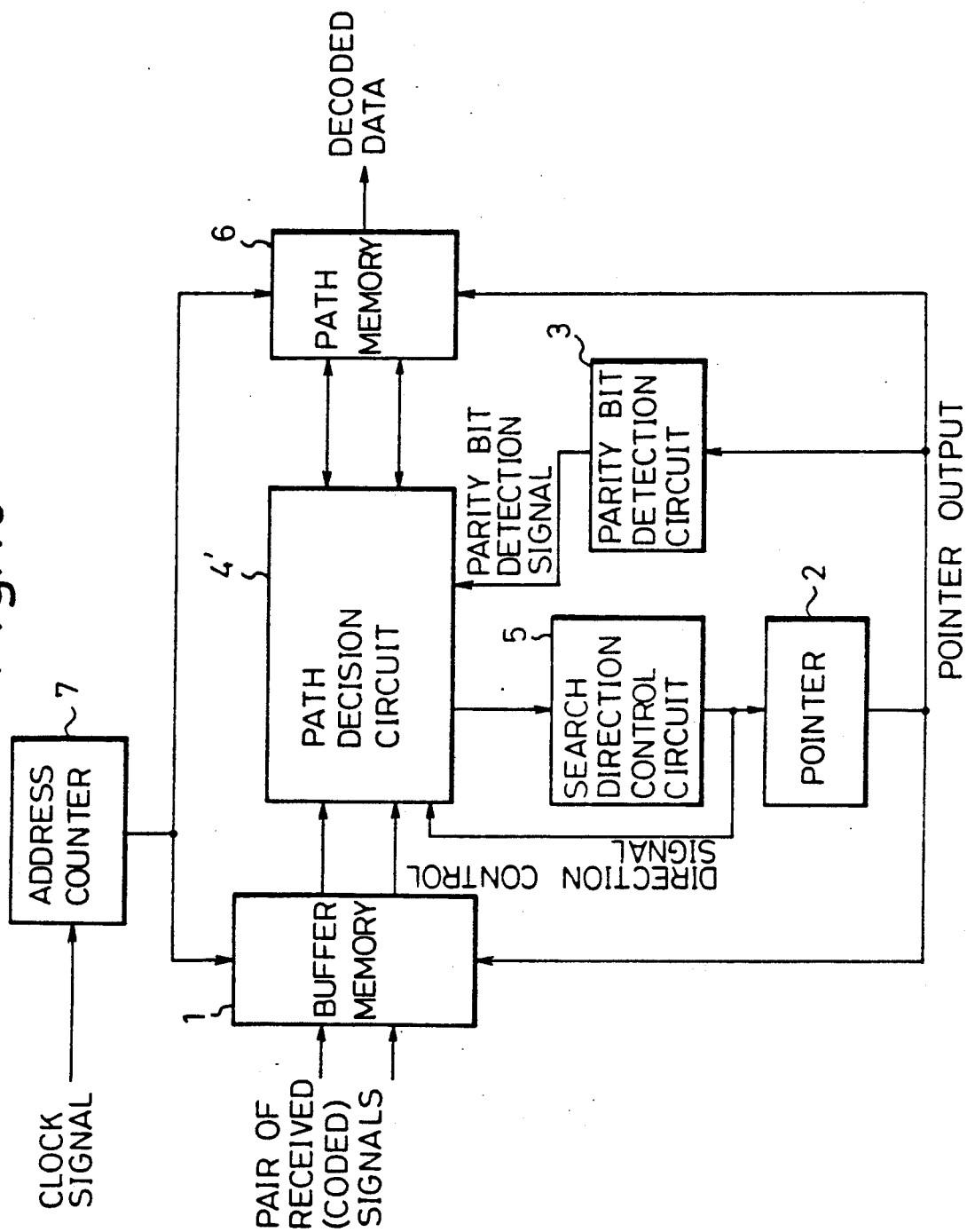
FIG. 10 is a block digram of the embodiment of the present invention.

FIG. 10 is a block diagram of the construction of the embodiment of the present invention.

Figure 4:
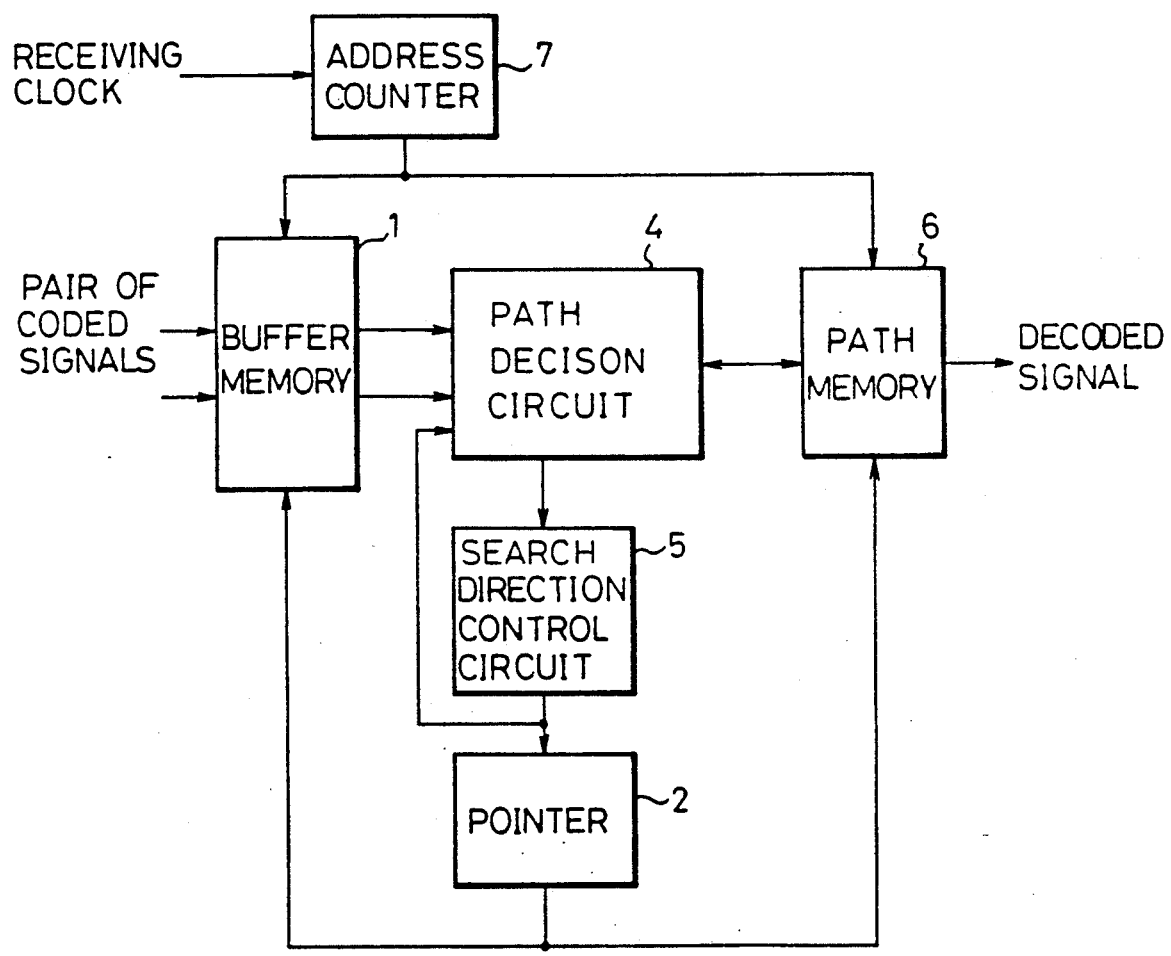
FIG. 4 is a block digram of a conventional sequential decoder receiving a pair of signal bits consisting of an information bit and a parity bit at one time and sequentially decoding each signal bit using the Fano algorithm.
Figure 6:
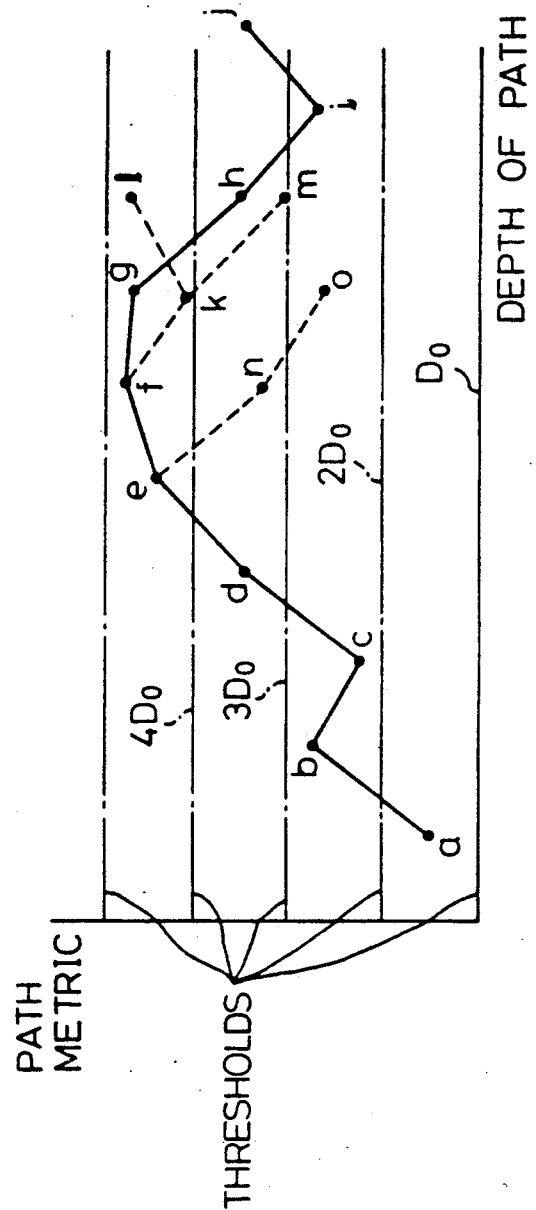
FIG. 6 is a digram of the path search according to the Fano algorithm.

In FIG. 10, the same reference numerals as FIG. 4 are respectively assigned to the components which appear in both of FIGS. 4 and 10. In addition, in FIG. 10, the function of the path decision circuit 4' is different from the aforementioned function of the path decision circuit 4 in the construction of FIG. 4, and a parity detection circuit 3 is added.

The input data of the construction of the sequential decoder shown in FIG. 10 is assumed to be a systematic and convolutional code signal having a code rate greater than $\frac{1}{2}$, consisting of information bits and parity bits. The code signal is paired, and each pair of the series of data bits are simultaneously input into the sequential decoder at each input timing. Each pair consists of an information bit and a parity bit, or two information bits, for example, as shown in FIG. 7.

The latter input requirement does not impose a substantial limit on the applicability of the sequential decoder of FIG. 10 and the present invention because any form of data consisting of information bits and parity bits and having a code rate greater than $\frac{1}{2}$ can be transformed into a two-row series form wherein each pair consists of an information bit and a parity bit, or two information bits. Although the two-row series bits of coded signal shown in FIG. 7 is an example of the coded signal which is generated by the punctured method, the scope of the present invention is not limited to the coded signal generated by the punctured method. The present invention and therefore the embodiment shown in FIGS. 10 to 13 are generally applicable to all systematic and convolutional code signals having a code rate greater than $\frac{1}{2}$.

Figure 11:
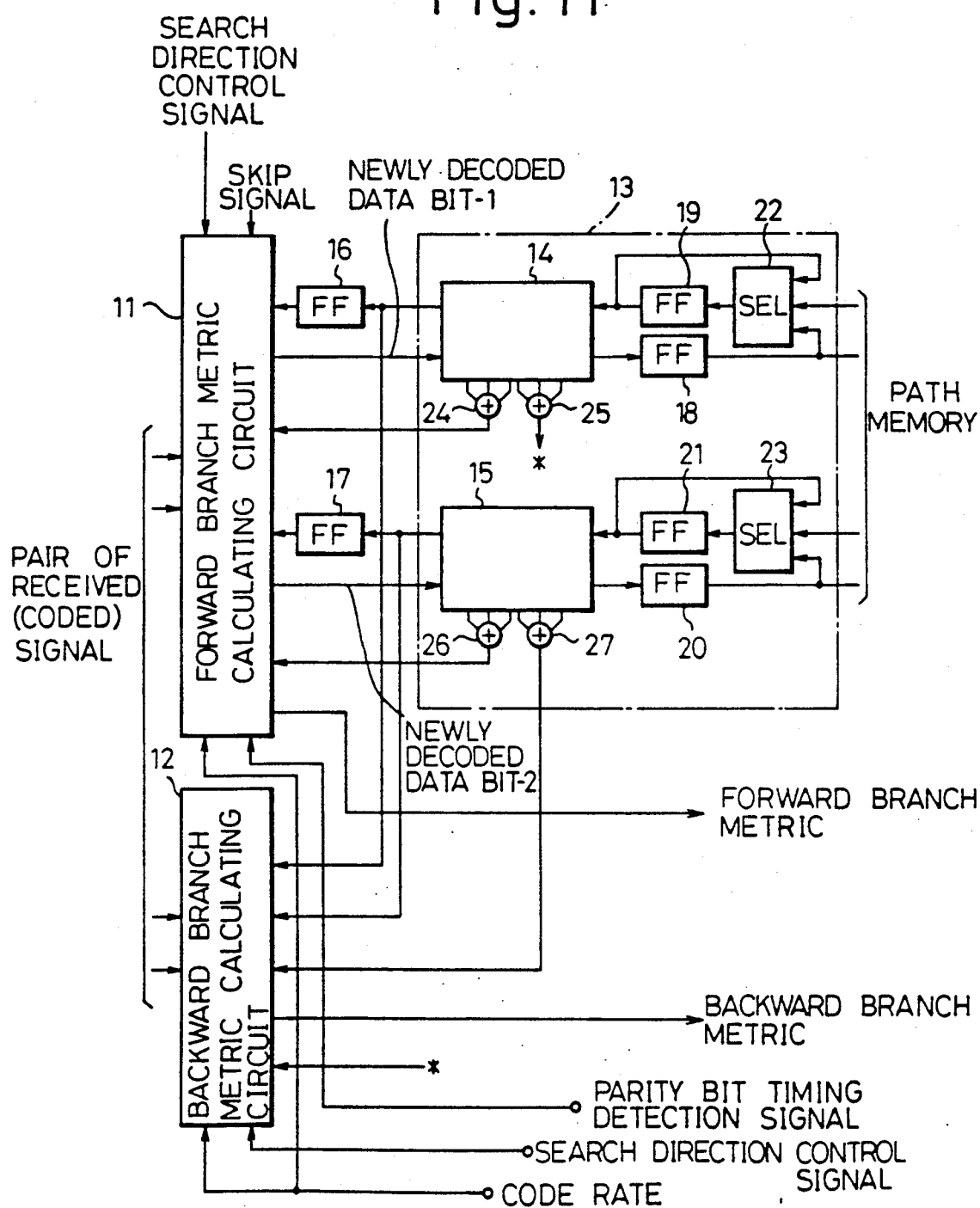
FIG. 11 is a block diagram of the path decision circuit 4' in the construction of the sequential decoder according to the present invention.

FIG. 11 is a block diagram of the construction of the path decision circuit 4' in the construction of the sequential decoder according to the present invention.

In FIG. 11, reference numeral 11 denotes a forward branch metric calculation circuit, 12 denotes a backward branch metric calculation circuit, 13 denotes an internal encoder portion, 14 and 15 each denote a shift register, 16, 17, 18, 19, 20, and 21 each denote a flip-flop circuit, 22 and 23 each denotes a selector, and 24, 25, 26, and 27 each denotes an adder of modulo two.

The forward branch metric calculation circuit 11 receives the aforementioned pair of coded signal bits at one time from the buffer memory 1, carries out the aforementioned forward search in the Fano algorithm. The forward branch metric calculation circuit 11 and outputs a branch metric from a node, the address of which is indicated by the pointer 2, to another node selected as a local most likely one by the above forward search, and the decoded signals corresponding to the selected node. The forward branch metric calculation circuit 11 further receives a search direction control signal, a skip signal, a parity bit timing detection signal, and the code rate data, as control signals.

The search direction control signal is the output of the aforementioned search direction control circuit 5 which is shown in FIG. 10 and functions the same as the search direction control circuit 5 shown in FIG. 4. The search direction control signal and indicates whether the forward search operation or the backward search should be carried out.

The code rate data is given to the forward branch metric calculation circuit 11 and the backward branch metric calculation circuit 12 because the Fano metric depends on the code rate.

The skip signal is generated by an overflow monitor circuit and a skip control circuit. The above overflow monitor circuit, the skip control circuit, and a switching portion are not shown in this application but are described in the U.S. Pat. No. 4,710,746 by the applicants. The switching portion (now shown) is incorporated in the final stage of the forward branch calculation circuit 11 to skip the error correcting operation by the forward branch metric calculation circuit 11 when an overflow of the buffer memory 1 due to an error-rich portion of the received data is detected in the overflow detector. Such an error-rich portion is detected when the phase in the QPSK demodulator is not matched. Therefore the above skip signal is applied to the forward branch metric calculation circuit 11 until the phase is matched.

The parity bit timing detection signal applied to the forward branch metric calculation circuit 11 and the backward branch metric calculation circuit 12 is generated in the parity bit timing detection circuit in FIG. 10.

The parity detection circuit 3 detects each timing of an input of a pair of bits comprised of an information bit and a parity bit in a two-bit form of a series of coded signals as shown in FIG. 7 according to the output of the pointer 2. When the input timing(s) of the pair of bits comprised of an information bit and a parity bit in one code length is determined in advance, the parity detection circuit 3 can detect the timing(s) of one or more inputs of one or more pairs of bits comprised of an information bit and a parity bit, in each cycle of the code length.

Figure 12:
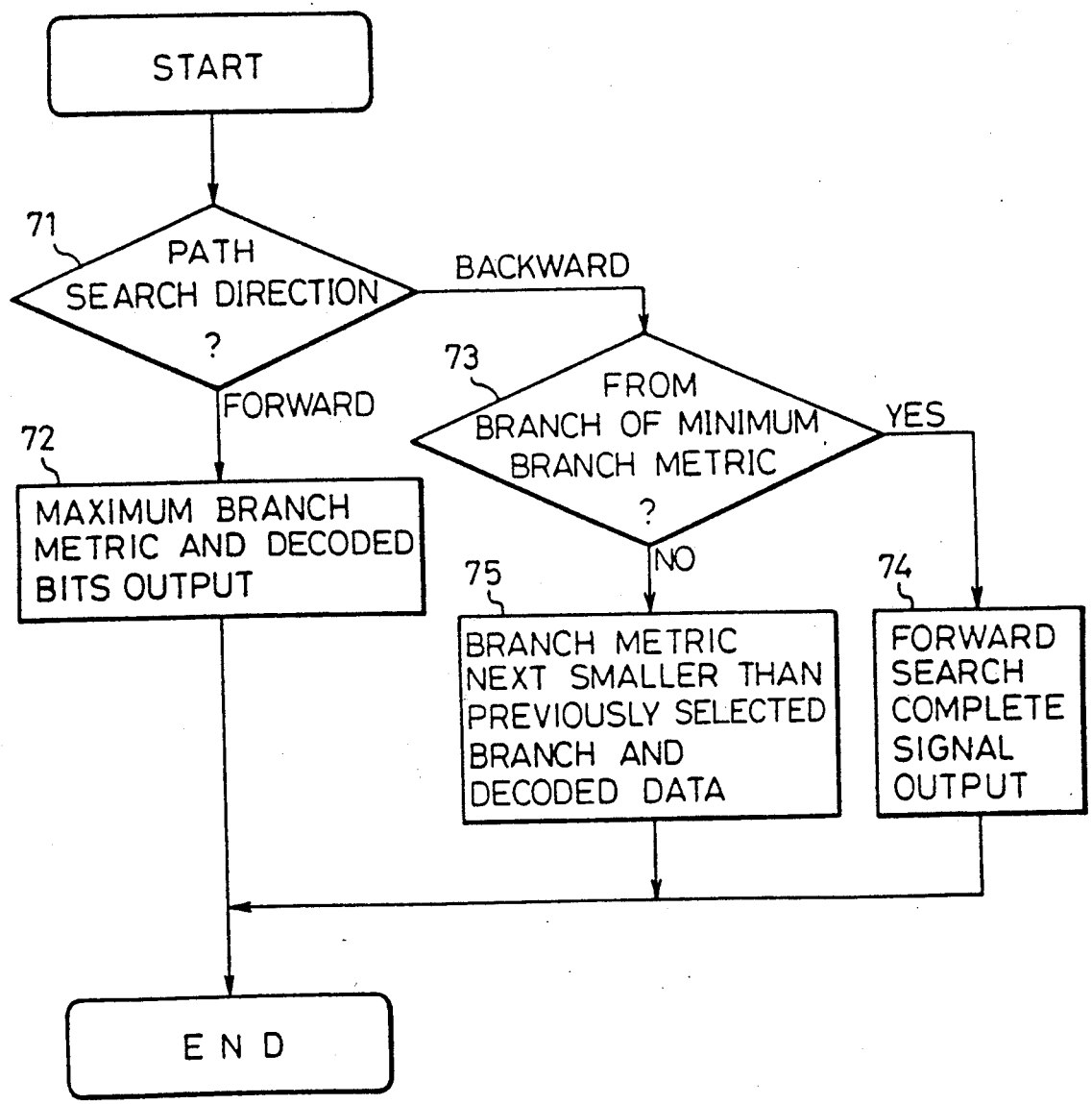
FIG. 12 is a flowchart for the operation of the forward branch metric calculating circuit 11 in FIG. 11.

The operation of the forward branch metric calculation circuit 11 is shown in the flow chart FIG. 12.

In the step 71 of FIG. 12, the direction of the search operation according to the Fano algorithm is determined from the status of the received search direction control signal.

If it is determined that the direction of the search is forward, the maximum branch metric in the forward direction from the node whose address is indicated by the pointer 2 is obtained, and the corresponding decoded signal bits are output. At the same time, the maximum branch metric is supplied to the search direction control circuit 5 of FIG. 10.

In the step 71 of FIG. 12, if it is determined that the direction of the search is backward, the operation goes to the step 73, and it is determined whether or not the operation has come back to the previous node from a branch corresponding to a minimum branch metric.

If "yes" is determined in the step 73, i. e., when the operation has just come back from a branch corresponding to a minimum branch metric, a forward search completion signal is output from the forward branch metric calculation circuit 11 in the step 74.

If "no" is determined in the step 73, i. e., when the operation has not come back from a branch corresponding to a minimum branch metric, a branch from the node whose branch metric is the next smaller than the branch metric of the branch through which the operation has just come back from the above wrong branch node, is selected, and the corresponding decoded signal bits are output. The above next smaller branch metric is supplied to the search direction control circuit 5 in the step 75.

Figure 13:
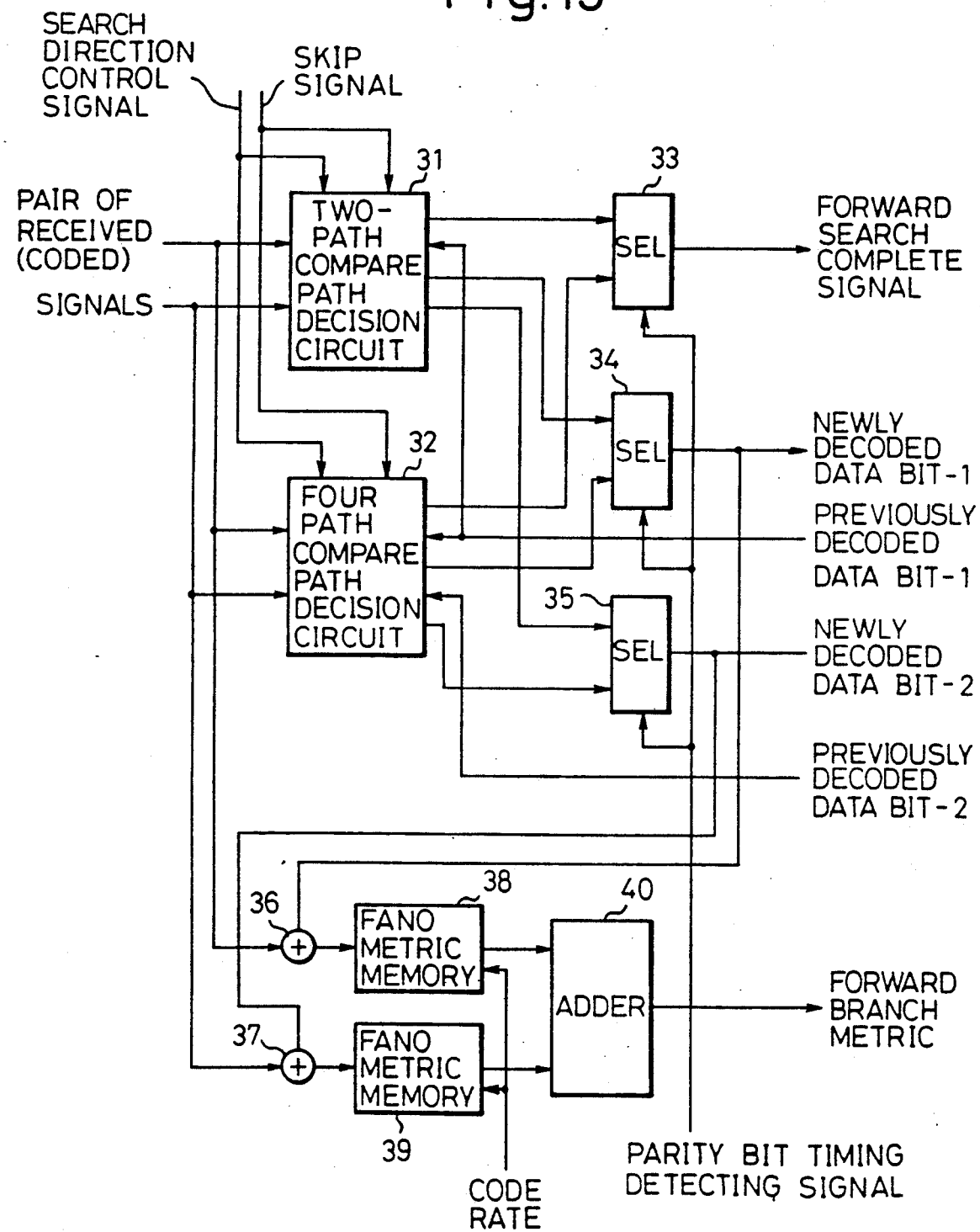
FIG. 13 is a block diagram of the forward branch metric calculating circuit 11 in FIG. 11.

Before explaining the operations of the other portions of the construction shown in FIG. 11, the construction of the forward branch metric calculation circuit 11 is explained reference to FIG. 13.

FIG. 13 is a block diagram of the forward branch metric calculation circuit 11 in FIG. 11.

In FIG. 13, reference numeral 31 denotes a two-path comparing path decision circuit, 32 denotes a four-path comparing path decision circuit, 33, 34, and 35 each denote a selector, 36 and 37 each denote an adder of modulo two, 38 and 39 each denote a Fano metric memory, and 40 denotes an adder.

The two-path comparing path decision circuit 31 is constructed by a hardware logic circuit. The two-path comparing decision circuit 31 realizes the aforementioned function of selecting a local most likely branch between two possible branches from the operating node corresponding to a reception of a pair of coded signal bits consisting of an information bit and a parity bit.

The path decision circuit 32 is constructed by a hardware logic circuit. The four-path comparing path decision circuit 32 and realizes the aforementioned function of selecting a local most likely branch among four possible branches from the operating node corresponding to a reception of a pair of coded signal bits consisting of two information bits.

In each of the above constructions of the two-path comparing path decision circuit 31 and the four-path comparing path decision circuit 32, the path metric can be defined in accordance with the procedure disclosed in the aforementioned publications, R. M. Fano, in "Heuristic Discussion of Probabilistic Decoding", IEEE Transaction of Information Theory, Vol. IT-19, April 1963, pp.64-73, and U.S. Pat. No. 3,457,562. Further, the following publications disclose the Fano algorithm and the constructions for carrying out the Fano algorithm: J. W. Layland and W. A. Lushbaugh, "Flexible High-Speed Sequential Decoder for Deep Space Channels", IEEE Transaction on Communication Technology, Vol. COM-19, No.5, October, 1971, pp.813-820; G. D. Forney, Jr., and E. K. Bower, "A High-Speed Sequential Decoder, Prototype Design and Test", IEEE Transaction on Communication Technology, Vol. COM-19, No.5, October 1971, pp.821-835; and K. Gilhousen and D. R. Lumb, "A Very High Speed Sequential Decoder" in the Proceedings of National Telecommunication Conference, 1972.

One of the above two-path comparing path decision circuit 31 and the four-path comparing path decision circuit 32 operates in accordance with the search direction control signal. The above-mentioned forward search completion signal, and each of two bits of the decoded signals are each selected in the corresponding selector 33, 34, or 35, in accordance with the parity bit timing detection circuit 3.

To each of the two-path comparing path decision circuit 31 and the four-path comparing path decision circuit 32, the previously decoded data bits necessary for the decision in each circuit is provided through the aforementioned shift register 14 or 15.

The decoded data bits which are output through the selectors 34 and 35 are each compared with the corresponding input bits at the adders 36 and 37, and the outputs of the adders 36 and 37 are each applied to the corresponding one of the Fano metric memories 38 and 39 as a read-out address. The Fano metric memories 38 and 39 hold the path metric values corresponding to all possible outputs of the corresponding adder 36 or 37, and each of the Fano metric memories 38 and 39 outputs the forward branch metric value corresponding to the comparison result in the adders 36 and 37. The outputs of the Fano metric memories 38 and 39 are added in the adder 40, and then the output of the adder 40 is supplied to the search direction control circuit 5.

Going back to the construction of FIG. 11, the backward branch metric calculation circuit 12 calculates the branch metric from the wrong node, which is detected in the search direction control circuit 6 by comparing the path metric with a threshold determined in accordance with the Fano algorithm, back to the previous node at which the wrong branch leading to the present wrong node was selected. The calculated result is supplied to the search direction control circuit 5 as a backward branch metric. The backward branch metric is then added to the path metric held in the search direction control circuit 5, and thus the path metric is renewed corresponding to the above process of going back to a previous operating node.

In the internal encoder portion 13 in FIG. 11, the shift register 14 and the adders 24 and 25 form an internal encoder, and the shift register 15 and the adders 26 and 27 form another internal encoder. Each of the internal encoders is equivalent to the encoder which encodes the transmitted signal on the sender side.

Each of the shift registers 14 and 15 shift data bits to the right or left in accordance with the output address of the pointer 2 shown in FIG. 10. Each of a pair of newly decoded signal bits are input into the corresponding one of the shift registers 14 and 15 from the left end.

Predetermined bits of the shift register 14 are connected to the adder 24, and the adder 24 outputs a parity bit corresponding to decoded signals from the forward branch metric calculation circuit 11. The parity bit is used in the forward branch metric calculation circuit 11 for determining the local most likely branch in accordance with the Fano algorithm.

The other adder 25 is connected to the bits of the shift register 14. Each of the bits is at a one-bit-delayed position from the corresponding one of the above predetermined bits for the adder 24. A parity bit obtained as the output of the adder 25 is used in the backward branch metric calculation circuit 12 for calculating the backward branch metric in accordance with the Fano algorithm.

The above one bit delay is necessary because the operating node is at the left end of a branch in a tree diagram when a forward branch metric is calculated, and the operating node is at the right end of a branch in a tree diagram when a backward branch metric is calculated. However, a branch metric is calculated as the path metric from the left end node of the branch to the right end node of the branch in the same manner in both the forward branch metric calculation circuit 11 and the backward branch metric calculation circuit 12.

In the construction of FIG. 11, the flip-flop circuit 16 is provided between the forward branch metric calculation circuit 11 and the shift register 14 in the backward direction. The flip-flop circuit 17 is provided between the backward branch metric calculation circuit 12 and the shift register 15 in the backward direction. The flip-flop circuit 18 is provided between the path memory 6 and the shift register 14 in the forward direction, and the flip-flop circuit 20 is provided between the path memory 6 and the shift register 15 in the forward direction. In addition, the flip-flop circuit 19 and the selector 22 are connected in series between the path memory 6 and the shift register 14 in the backward direction, and the flip-flop circuit 21 and the selector 23 are connected in series between the path memory 6 and the shift register 15 in the backward direction. The selector 22 receives the outputs of the flip-flop circuits 18 and 19 and the output of the path memory 6, and applies its output to the flip-flop circuit 19. The selector 23 receives the outputs of the flip-flop circuits 20 and 21 and the output of the path memory 6, and applies its output to the flip-flop circuit 20.

When a branch is selected and the branch metric is calculated in the step 75 of FIG. 12, previously decoded data which is held in the construction between the forward branch metric calculation circuit 11 and the path memory 6 are used. The decoded data to be used in the forward branch metric calculation circuit 11 is transferred through the selectors 22 and 23, the flip-flop circuits 19 and 21, the shift registers 14 and 15, and the flip-flop circuits 16 and 17 to the forward branch metric calculation circuit 11. Or when a backward branch metric is calculated, the decoded data to be used in the backward branch metric calculation circuit 12 is transferred through the selectors 22 and 23, the flip-flop circuits 19 and 21, and the shift registers 14 and 15.

When a branch is selected and the branch metric is calculated in the step 75 of FIG. 12, decoded data bits (information bits) which are generated in the preceding operating node in the backward direction are held in the flip-flop circuits 16 and 17.

A decoded data bit output from the right end of the shift register 14 or 15 is held respectively in the flip-flop circuit 18 or 20. If data bits between the forward branch metric calculation circuit 11 and the path memory 6 are shifted in the backward direction in the next operation, the data bit held in the flip-flop circuit 18 or 20 is input into the flip-flop circuit 19 or 21 through the selector 22 or 23, and then input into the right end bit of the shift register 14 or 15. Since it takes considerable time to read out a data bit held in the path memory, the above construction of the flip-flop circuits 18, 19, 20, and 21, and the selectors 22 and 23 eliminate the waiting time for reading out a first bit from the path memory 6.

Further, since the pointer address is not shifted when the threshold value is lowered in accordance with the Fano algorithm, the decoded data bits in the flip-flop circuits 19 and 21 are each maintained in a loop which is made by connecting the output of the flip-flop circuit 19 or 21 to its own input, respectively.

In the conventional sequential decoder, only a two-path decision circuit and only one shift register, through which decoded information bits are shifted to the right or left, and in which internal encoding (generation of parity bits) is carried out using bits at predetermined positions, are provided in the path decision circuit 4 in the construction of FIG. 4. Therefore, only one information bit is processed for one output address of the pointer 5 of FIG. 4. Since there is a limit in the renewal speed of the pointer 5, which is determined by the operating clock of the sequential decoder, the renewal speed imposes a limit on the processing speed of the decoding.

However, in the construction of the embodiment of the present invention as shown in FIGS. 11 and 13, when a pair of information bits is input into the sequential decoder, the decoded output of the four-path comparing path decision circuit 32 including two decoded information bits are selected as the output of the forward branch metric calculation circuit 11. Then each of the decoded information bits is input into the left end bit of the corresponding one of the shift registers 14 and 15. Therefore, when a pair of information bits are input into the sequential decoder, two information bits are processed for an address of the pointer 2. Thus, the processing speed of the sequential decoder is increased by the present invention.

We claim:

1. A sequential decoder for decoding a systematic and convolutional code signal having a code rate greater than ½ and carrying out error correction coding of said code signal, comprising:

path decision means for determining a local most likely path in a plurality of possible paths for a newly received information bit by calculating a branch metric indicating likelihood of each of said plurality of possible paths in accordance with a predetermined algorithm, said path decision means comprising:

two-path comparing path decision means for receiving a pair of bits comprised of an information bit and a parity bit at one time and determining a local most likely path between two possible paths for said information bit;

four-path comparing path decision means for receiving a pair of information bits at one time and determining a local most likely path among four possible paths for said pair of information bits;

parity bit timing detecting means for detecting a timing of an input of said pair of bits comprised of an information bit and a parity bit; and selecting means for selecting an output of said two-path comparing path decision means when said input timing of said pair of bits comprised of an information bit and a parity bit is detected, and selecting an output of said four-path comparing path decision means when said pair of information bits is received.

2. A sequential decoder according to claim 1, further comprising a path memory for receiving and holding an output of said path decision circuit; and wherein each of said two-path comparing path decision means and said four-path comparing path decision means respectively comprise a shift register means for transferring each output bit of said path decision means by shifting between said path decision means and said path memory.

3. A sequential decoder according to claim 2, wherein, each of said two-path comparing path decision means and said four-path comparing path decision means respectively further comprise an internal encoder along with each of said shift registers.

4. A sequential decoder according to claim 1, further comprising a pointer for outputting an operating address of said path decision circuit, corresponding to each pair of bits input into said path decision circuit, and wherein said parity bit timing detecting means detecting said input timing of said pair of bits comprised of an information bit and a parity bit by monitoring each output of said pointer.

5. A method for decoding a systematic and convolutional code signal having a code rate greater than $\frac{1}{2}$ and carrying out error correction coding of the code signal, said method comprising the steps of:

(a) determining the direction of the search operation;

(b) obtaining a maximum branch metric in the forward direction when the direction of the search is determined to be forward;

(c) obtaining a branch corresponding to a minimum branch metric when the direction of the search is determined to be backward;

(d) outputting a search completion signal when the operation has returned from a branch corresponding to a maximum branch metric; and (e) outputting decoded signal bits when the operation has returned from a branch corresponding to a minimum branch metric.

* * * * *

UNITED STATES PATENT AND TRADEMARK OFFICE
CERTIFICATE OF CORRECTION

PATENT NO. : 5,014,275

DATED : MAY 7, 1991

INVENTOR(S) : KANEYASU SHIMODA ET AL.

It is certified that error appears in the above-identified patent and that said Letters Patent is hereby corrected as shown below:

Title PAGE [56] References Cited, after this section, line 5, insert the following section:

--OTHER PUBLICATIONS

R.M. Fano, "Heuristic Discussion of Probabilistic Decoding", IEEE Transaction of Information Theory, Vol. T-19, April 1963, pp. 64-73

J. W. Layland et al., "Flexible High-Speed Sequential Decoder for Deep Space Channels", IEEE Transaction on Communication Technology, Vol. COM-19, No. 5, October 1971, pp. 813-820

F. Jelinek, "A Fast Sequential Decoding Algorithm Using a Stack", IBM J. Res. Dev., Vol. 13, November 1969, pp. 675-685

K. Gilhousen et al., "A Very High Speed Sequential Decoder", Proceedings of National Telecommunication Conference, IEE 1972, pp. 13C-1-13C-5.

G. D. Forney, Jr., et al., "A High Speed Sequential Decoder, Prototype Design and Test", IEEE Transaction on Communication Technology, Vol. COM-19, No. 5, October 1971, pp. 821-835.--.

UNITED STATES PATENT AND TRADEMARK OFFICE
CERTIFICATE OF CORRECTION

PATENT NO. : 5,014,275

DATED : MAY 7, 1991

INVENTOR(S) : KANEYASU SHIMODA ET AL.

It is certified that error appears in the above-identified patent and that said Letters Patent is hereby corrected as shown below:

Col. 3, line 13, "tothe" should be --to the--;
       line 18, "next, i.e.," should be --next. That is,--;
       line 36, "search" should be --search.--.

Col. 4, line 31, "possible in" should be --possible paths in--.

Col. 5, line 53, "(0,1)" should be --(0,1))--.

Col. 6, line 50, "and" should be deleted.

Col. 8, line 3, "The path" should be --The four-path comparing path--.

Signed and Sealed this

Twelfth Day of January, 1993

Attest:

DOUGLAS B. COMER

*Attesting Officer*     *Acting Commissioner of Patents and Trademarks*